(12) United States Patent
Altolaguirre et al.

(10) Patent No.: US 10,171,068 B1
(45) Date of Patent: Jan. 1, 2019

(54) INPUT INTERFACE CIRCUIT

(71) Applicant: MStar Semiconductor, Inc., Hsinchu, Hsien (TW)

(72) Inventors: Federico Agustin Altolaguirre, Hsinchu Hsien (TW); Yen-Hung Yeh, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/915,243

(22) Filed: Mar. 8, 2018

(30) Foreign Application Priority Data

Feb. 1, 2018  (TW) .............................. 107103619 A

(51) Int. Cl.
| | | |
|---|---|---|
| *H03K 19/0175* | (2006.01) | |
| *H03K 5/08* | (2006.01) | |
| *H03K 17/16* | (2006.01) | |
| *H03K 19/21* | (2006.01) | |
| *H03K 17/08* | (2006.01) | |

(52) U.S. Cl.
CPC ............. *H03K 5/08* (2013.01); *H03K 17/162* (2013.01); *H03K 17/08* (2013.01); *H03K 19/017509* (2013.01); *H03K 19/21* (2013.01)

(58) Field of Classification Search
CPC ............... H03K 5/003; H03K 19/0175; H03K 19/01709; H03K 19/017545; H03K 9/0185; H03K 19/01759; G06F 3/00; G06F 3/1295

USPC .................................................. 327/261, 333
See application file for complete search history.

(56) References Cited

U.S. PATENT DOCUMENTS

| | | | | |
|---|---|---|---|---|
| 6,323,712 B1* | 11/2001 | Shih | ....................... | H03K 5/086 327/276 |
| 2004/0104756 A1* | 6/2004 | Payne | .............. | H03K 3/356113 327/333 |
| 2012/0206180 A1* | 8/2012 | Lin | ..................... | H03K 19/0013 327/175 |
| 2015/0062761 A1* | 3/2015 | Chen | ...................... | H03K 3/013 361/56 |

* cited by examiner

*Primary Examiner* — John W Poos
(74) *Attorney, Agent, or Firm* — Edell, Shapiro & Finnan, LLC

(57) ABSTRACT

An input interface circuit is provided. When a pad voltage is higher than a default operating voltage, a clamping circuit maintains the voltage at a first node at the default operating voltage. A first inverter is coupled between the first node and a second node. A voltage of a third node is adjusted along with the pad voltage (input end of a high-voltage buffering circuit) and the voltage at the second node, and causes the voltage at the third node has a same voltage change trend as the pad voltage. A second inverter is coupled between the third node and a fourth node. A voltage recovery circuit has its input end coupled to the fourth node and its output end coupled to the third node, and selectively couples the third node to a power line or a ground line according to the voltage at the fourth node.

7 Claims, 5 Drawing Sheets

INPUT INTERFACE CIRCUIT

This application claims the benefit of Taiwan application Serial No. 107103619, filed Feb. 1, 2018, the subject matter of which is incorporated herein by reference.

BACKGROUND OF THE INVENTION

Field of the Invention

The invention relates to an input interface circuit performing high-low voltage conversion.

Description of the Related Art

Dimensions of devices in a semiconductor manufacturing process generally correspond to an operating voltage. For example, a default operating voltage of a complementary metal-oxide semiconductor field-effect transistor (MOSFET) made by a 0.35 μm manufacturing process is 3.3 V, and a default operating voltage of a MOSFET made by a 0.18 μm manufacturing process is 1.8 V. To provide compatibility with various signal standards, a part of an input interface of some circuits is designed to be able to receive signals higher than the default operating signal; for instance, a circuit formed by a MOSFET made by a 0.18 μm manufacturing process is designed to be able to receive a signal having a 3.3-V amplitude.

FIG. 1 shows an example of an input interface circuit capable of receiving digital signals in a voltage twice a default operating voltage thereof. The default operating voltage is represented by VDD, and a voltage at a ground end is represented by VSS. The input interface circuit 100 receives via a pad P a voltage $V_P$ having an amplitude range between zero and twice VDD (to be represented by 2*VDD), converts the voltage $V_P$, and provides a voltage $V_{IN}$ having an amplitude range between zero and VDD at a node $M_N$. More specifically, the signal originally having a voltage value of 2*VDD, which is inputted at the pad P, is converted to a signal having a voltage value of VDD when transmitted to the node $N_{IN}$. The signal originally having zero voltage, which is inputted at the pad P, is maintained as a signal having zero voltage when transmitted to the node $N_{IN}$.

The input interface circuit 100 includes two parts: 1) a clamping circuit 110 formed by N-type transistors MNC1 and MNC2; and 2) a Schmitt trigger 120 formed by two P-type transistors MPST and MPI and four N-type transistors MNST1, MNST2, MNFB and MNI. The clamping circuit 110 clamps a voltage $V_1$ at a node $N_1$ to VDD as an upper limit, so as to protect the transistors MPST, MNST1 and MNST2 from having to withstand a 2*VDD cross voltage (which may result in damages in a dielectric layer in gates thereof) between drains and gates thereof over an extended period of time. The Schmitt trigger 120 provides high-low voltage transition with a hysteresis characteristic, and hence an input/output transition curve (i.e., a relationship between the voltage $V_P$ and the voltage $V_{IN}$) of the input interface circuit 100 has two thresholds. A so-called "rising threshold" refers to threshold that causes the voltage $V_{IN}$ to transit from a low level to a high level when the voltage $V_P$ rises beyond the threshold. On the other hand, a so-called "falling threshold" refers to threshold that causes the voltage $V_{IN}$ to transit from a high level to a low level when the voltage $V_P$ falls beyond the threshold. The two thresholds are controlled through setting dimensions of transistors in the Schmitt trigger 120.

In the input interface circuit 100, the process of the voltage $V_P$ rising from zero value (0) towards 2*VDD can be divided into three phases: 1) rising from 0 to (VDD−$V_{TH}$), where $V_{TH}$ represents a threshold voltage of the transistor MNC2; 2) rising from (VDD−$V_{TH}$) to VDD; and 3) rising from VDD to 2*VDD. During the period of the voltage $V_P$ rising from zero to (VDD−$V_{TH}$), the transistor MNC1 is turned off and the transistor MNC2 is turned on, such that the voltage $V_1$ at the node $N_1$ similarly rises from zero to (VDD−$V_{TH}$). Next, the voltage $V_1$ rises along with the voltage $V_P$, and once the voltage $V_1$ exceeds (VDD−$VT_H$), the transistor MNC2 becomes turned off (the transistor MNC1 at this point remains turned off). Only when the voltage $V_P$ continues to rise to be equal to or higher than VDD, the transistor MNC1 becomes turned on, and the voltage $V_1$ is continually pulled up and is clamped at VDD after the voltage $V_P$ rises beyond (VDD+$V_{TH}$).

A drawback of the input interface circuit 100 is that, during the process of the voltage $V_P$ rising from (VDD−$V_{TH}$) to VDD, the transistors MNC1 and MNC2 are not turned on, and the node $N_1$ hence stays in a floating state. When the node $N_1$ is floating, it means the voltage $V_1$ may be varied without control, such that the voltage $V_{IN}$ is also unstable. To minimize the risks brought by such uncertainty, the rising threshold of the input interface circuit 100 is usually set to be lower than (VDD−$V_{TH}$). For an input interface circuit that receives digital signals having an amplitude range between 0 and 2*VDD, many circuit standards specify that the falling threshold of the input interface circuit 100 is set to a half of VDD. Taking VDD as 1.8 V and the threshold $V_{TH}$ as 0.7 V for example, the difference between the rising threshold and the falling threshold is only 0.2 V (=1.8−0.7−1.8/2). As the difference between the two thresholds gets smaller, the noise tolerance of the circuit gets weaker; that is, the accuracy of input/output ($V_{IN}/V_P$) conversion of the input interface circuit 100 is more likely affected by noise.

SUMMARY OF THE INVENTION

To solve the above issue, the present invention provides an input interface circuit having a rising threshold that is not retrained by a limitation of being lower than a voltage (VDD−$V_{TH}$), and providing a more robust noise resistance capability by increasing a difference between a rising threshold and a falling threshold.

An input interface circuit is provided according to an embodiment of the present invention. The input interface circuit includes a power line, a ground line, an input pad, a clamping circuit, a first inverter, a high-voltage buffering circuit, a second inverter, a voltage recovery circuit and a third inverter. The power line provides a default operating voltage. The ground line provides a ground voltage. The input pad receives a pad voltage. The clamping circuit is coupled between the input pad and a first node, and maintains the voltage at the first node at the default operating voltage when the pad voltage is higher than the default operating voltage. The first inverter has its input end coupled to the first node, and its output end coupled to a second node. The high-voltage buffering circuit has a first input end, a second input end and an output end, with the first input end coupled to the input pad, the second input end coupled to the second node, and the output end coupled to a third node, wherein a voltage at the third node is adjusted along with the pad voltage and the voltage at the second node, and the voltage at the third node has a same voltage change trend as the pad voltage. The second inverter has its input end coupled to the third node and its output end coupled to a fourth node. The voltage recovery circuit is connected between the power line and the ground line, and has an input end and an output end, with the input end coupled to the fourth node and the input end coupled to the third node. The voltage recovery circuit selectively couples the third node to the power line or the ground line according to the voltage at the fourth node. The third inverter has its input end coupled to the fourth node, and its output end providing a converted voltage.

The above and other aspects of the invention will become better understood with regard to the following detailed description of the preferred but non-limiting embodiments. The following description is made with reference to the accompanying drawings.

Figure 1:
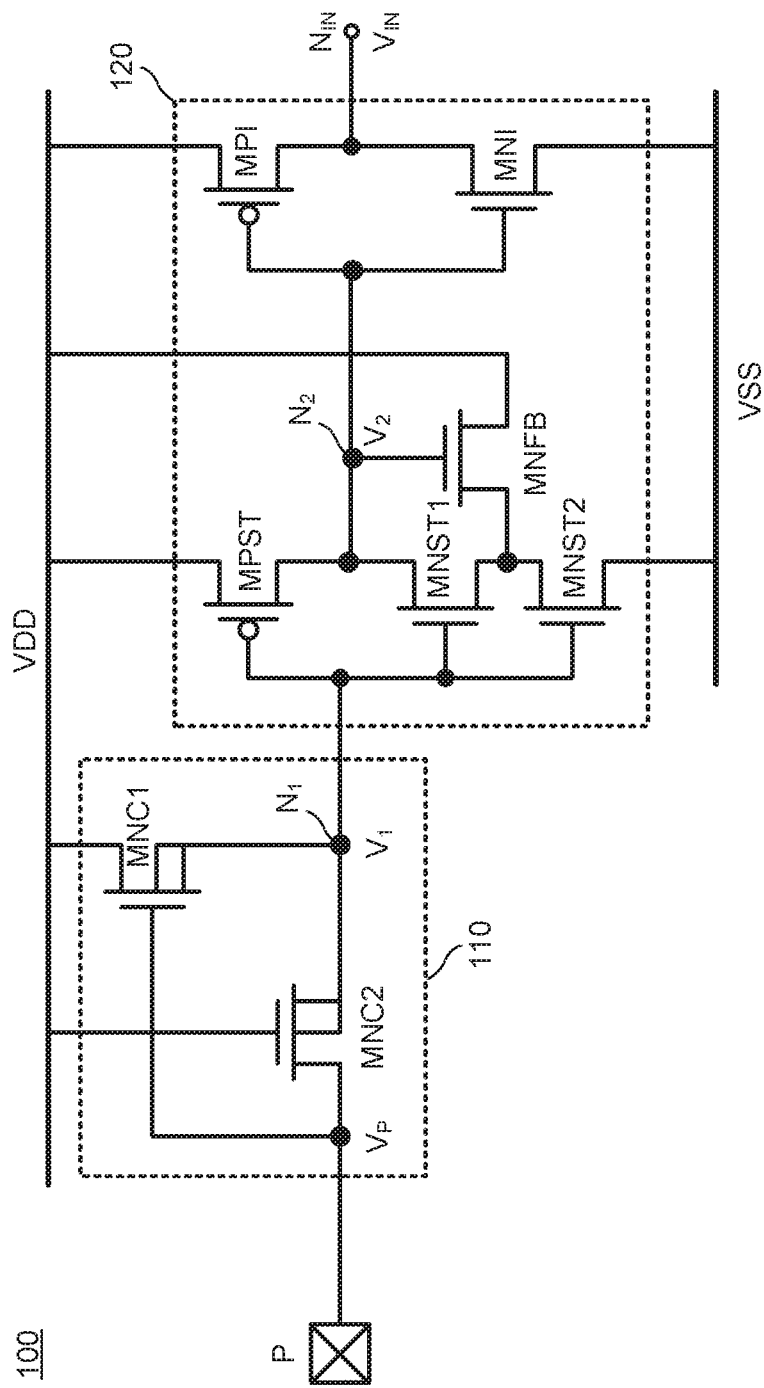
FIG. 1 (prior art) is an example of an input interface circuit capable of receiving digital signals having a voltage twice a default operating voltage thereof.

It should be noted that, the drawings of the present invention include functional block diagrams of multiple functional modules related to one another. These drawings are not detailed circuit diagrams, and connection lines therein are for indicating signal flows only. The interactions between the functional elements/or processes are not necessarily achieved through direct electrical connections. Further, functions of the individual elements are not necessarily distributed as depicted in the drawings, and separate blocks are not necessarily implemented by separate electronic elements.

DETAILED DESCRIPTION OF THE INVENTION

Figure 2:
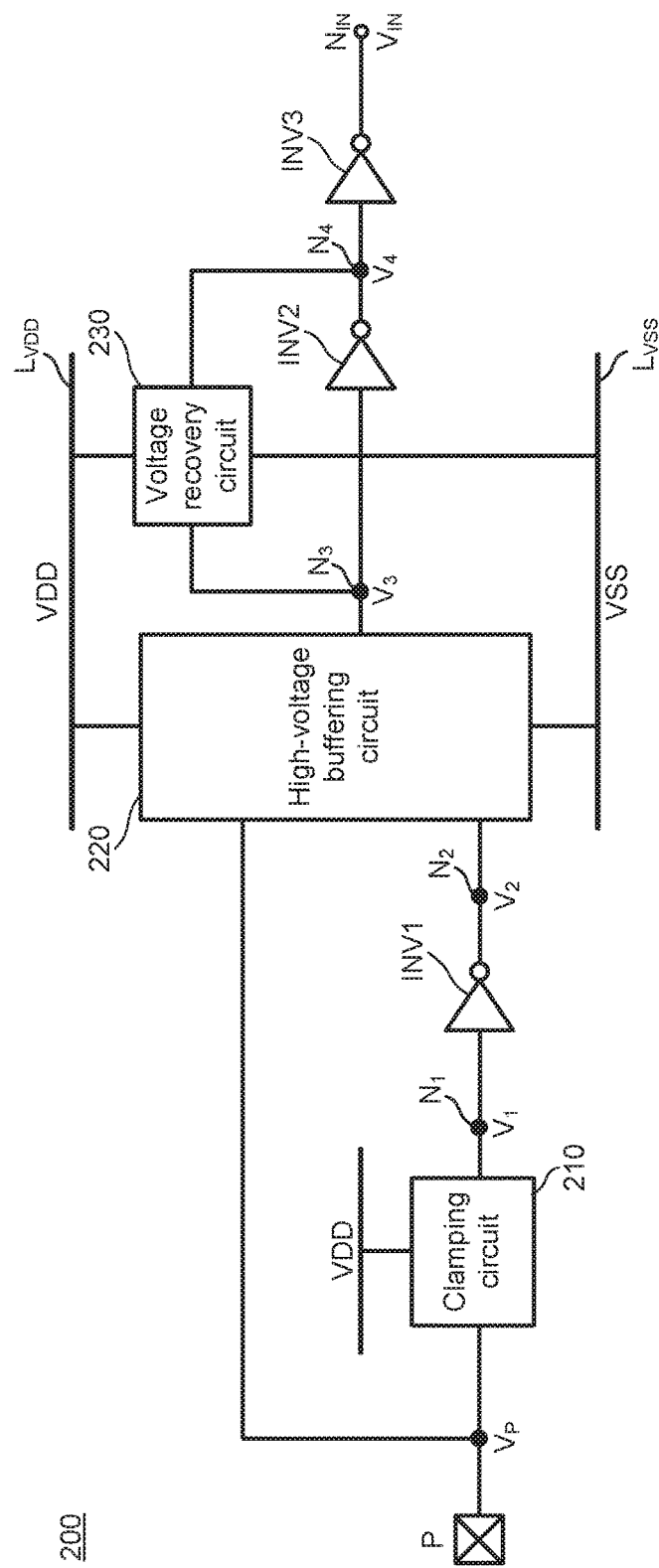
FIG. 2 is a function block diagram of an input interface circuit according to an embodiment of the present invention.

FIG. 2 shows a function block diagram of an input interface circuit according to an embodiment. A default operating voltage of the input interface circuit 200 is represented as VDD, a range of receiving voltage (to be referred to as a pad voltage $V_P$) of input pad P of the input interface circuit 100 is from zero to 2*VDD, and a voltage at a ground terminal of the input interface circuit 200 is represented as VSS. Further, a denotation $V_{TH}$ is used to represent threshold voltages of N-type transistors in this manufacturing process. In practice, the input interface circuit 200 may be integrated into various integrated circuit chips needing to receiving digital signals having a voltage twice the default operating voltage thereof. As shown in FIG. 2, the input interface circuit 200 includes a power line $L_{VDD}$, a ground line $L_{VSS}$, an input pad P, a clamping circuit 210, a high-voltage buffering circuit 220, a voltage recovery circuit 230, and three inverters INV1 to INV3. Functions and connection relationships of these circuits are given with reference to FIG. 2 below.

The clamping circuit 210 is coupled between the input pad P and a first node $N_1$. When the pad voltage $V_P$ is higher than the default operating voltage VDD, the clamping circuit 210 causes a voltage $V_1$ at the first node $N_1$ to be maintained at the default operating voltage VDD, so as to prevent the inverter INV1 coupled between the first node $N_1$ and a second node $N_2$. When the pad voltage $V_P$ is lower than or equal to the default operating voltage VDD, the clamping circuit 210 causes the voltage $V_1$ at the first node $N_1$ to be equal to the pad voltage $V_P$.

The high-voltage buffering circuit 220 has two input ends and one output end. One of the input ends is coupled to the input pad P, the other input end is coupled to a second node $N_2$, and the output end is coupled to the third node $N_3$. A voltage $V_3$ at the third node $N_3$ is adjusted along with the pad voltage $V_P$ (input end of the high-voltage buffering circuit) and the voltage at the second node $N_2$, such that the voltage $V_3$ has the same voltage change trend as the pad voltage $V_P$.

The voltage recovery circuit 230 has its input end coupled to a fourth node N4, and its output end coupled to the third node $N_3$. The third node $N_3$ can be coupled to the power line $L_{VDD}$ or to the ground line $L_{VSS}$ depending on a voltage $V_4$ at the fourth node N4 (the input end of the voltage recovery circuit 230).

The inverter INV2 is coupled between the third node $N_3$ and the fourth node N4, and the inverter INV3 is coupled between the fourth node N4 and an output node $N_{IN}$. A voltage $V_{IN}$ that the inverter INV3 provides at the output node $N_{IN}$ is a converted voltage generated by the input interface circuit 200.

The input interface circuit 200 provides high-low voltage transition having a hysteresis characteristic. A falling threshold of the input interface circuit 200 is primarily controlled by the dimension of transistors in the inverter INV1, and a rising threshold of the input interface circuit 200 is primarily controlled by the high-voltage buffering circuit 220 and the dimension of transistors in the inverter INV2. Details for setting the falling threshold and the rising threshold are given in the detailed embodiments of the circuits in the input interface circuit 200 with reference to FIG. 3.

Figure 3:
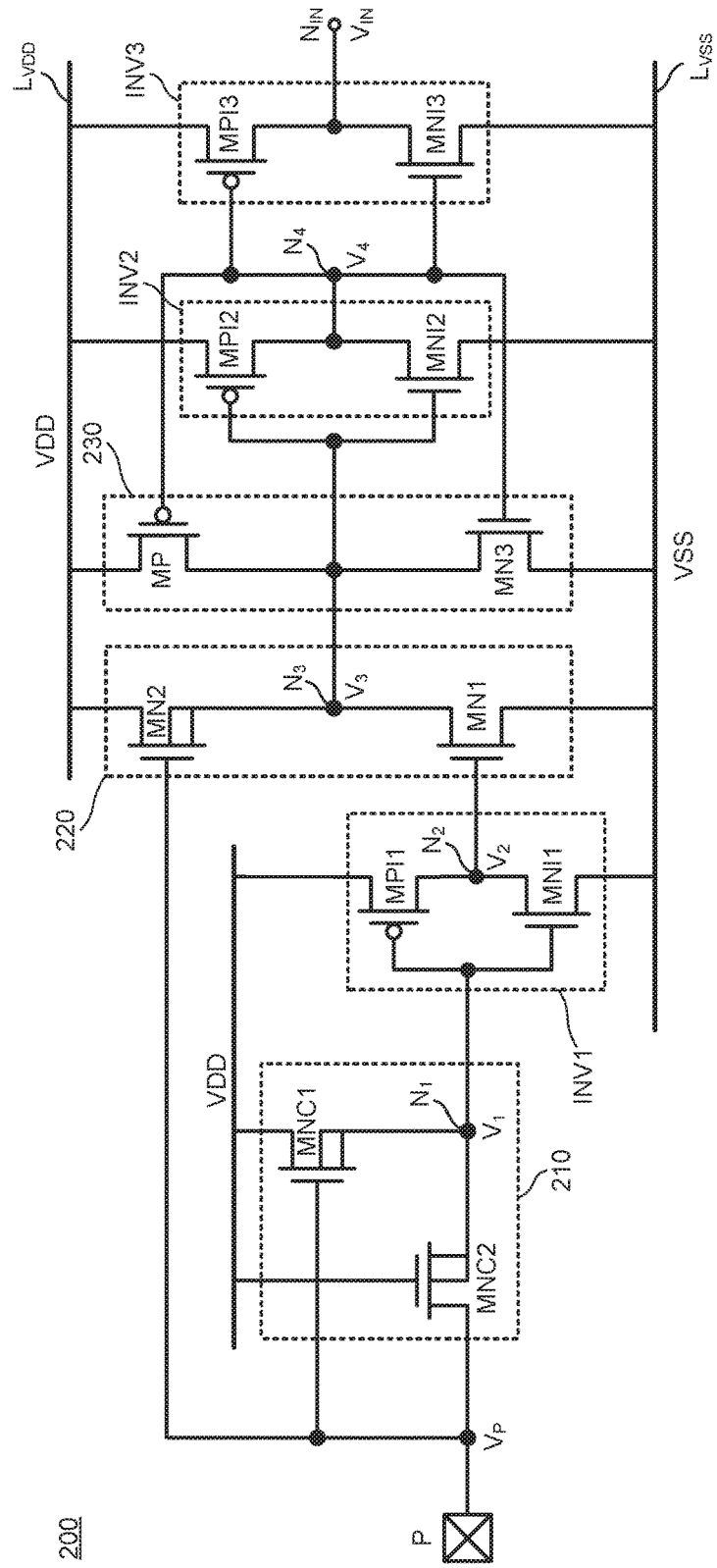
FIG. 3 is a circuit diagram of an input interface circuit according to an embodiment of the present invention.

In the embodiment in FIG. 3, the clamping circuit 210 includes two N-type transistors MNC1 and MNC2, and the inverter INV1 includes one N-type transistor MN1 and a P-type transistor MPI1. By clamping the voltage $V_1$ at the first node $N_1$ to VDD as upper limit, the clamping circuit 210 is capable of protecting the transistor MNI1 in the inverter INV1 from the 2*VDD cross voltage between the drain and the gate over an extended period of time.

A scenario where the voltage $V_P$ is zero (i.e., the ground voltage VSS) is first discussed. When the voltage $V_P$ is zero, the voltage $V_1$ is also zero. At this point, the inverter INV1 causes the voltage $V_2$ at the second node $N_2$ to be equal to VDD, so as to further control the transistor MN1 to pull down the voltage $V_3$ at the node $N_3$ to zero. Under the effect of the inverters INV2 and INV3, the converted voltage $V_{IN}$ at the output node $N_{IN}$ is zero. In the above situation, the transistor MN2 in the high-voltage buffering circuit 220 is in turned off. Because the voltage $V_4$ at the fourth node N4 is equal to VDD, the transistor MP is also turned off; the transistor MN3 in the voltage recovery circuit 230 is turned on, and the third node $N_3$ is coupled to the ground line $L_{VSS}$ to help pull down the voltage $V_3$ to zero.

A scenario where the voltage $V_P$ starts rising towards 2*VDD is discussed next. Before the voltage $V_P$ rises to the voltage $V_{TH}$, the transistor MN2 is turned off. After the voltage $V_P$ becomes higher than the voltage $V_{TH}$, the transistor MN2 starts to be turned on such that the voltage $V_3$ is pulled up towards ($V_P$–$V_{TH}$). On the other hand, when the voltage $V_P$ gradually rises from zero, the voltage $V_1$ also rises. During the period in which the voltage $V_P$ rises from zero to (VDD–$V_{TH}$), the transistor MNC2 that is turned on in the clamping circuit 210 causes the voltage $V_1$ at the first node $N_1$ to rise at the same time. Before the voltage $V_1$ reaches the state conversion threshold (to be represented by $VT_{INV1}$) of the inverter INV1, the voltage $V_2$ is kept at VDD, which maintains the transistor MN1 turned on. Similarly, before the voltage $V_3$ is pulled up to a state conversion threshold (to be represented by $VT_{INV2}$) of the inverter INV2, the voltage $V_4$ is kept at VDD, which maintains the transistor MN3 turned on. Thus, during the period in which the voltage $V_3$ is higher than the voltage $V_{TH}$ but has not yet reached $VT_{INV2}$, the conducted transistors MN3, MN1 and MN2 individually affect the voltage $V_3$.

After the voltage $V_1$ becomes higher than $VT_{INV}$ along with the voltage $V_P$, the inverter INV1 turns off the transistor MN1 so that it stops the transistor MN1 from affecting the voltage $V_3$. At this point, the transistor MN2 first provides a current to pull up the $V_3$ and continues to pull down the voltage $V_3$ to counterbalance the transistor MN3. As previously described, the turned-on transistor MN2 causes the voltage $V_3$ to be pulled up towards ($V_P$–$V_{TH}$). Before $V_3$ reaches $VT_{INT2}$, the voltage $V_4$ at the output end of the inverter INV2 is equal to VDD such that the transistor NMN3 is kept turned on. After the voltage $V_P$ becomes higher than ($VT_{INT2}$+$V_{TH}$), the transistor MN2 can pull the voltage $V_3$ to be higher than $VT_{INV2}$, so as to lower the voltage $V_4$ to zero under the effect of the inverter INV2, to turn off the transistor MN3. Meanwhile, because the voltage $V_4$ is zero, the transistor MP controlled by the voltage $V_4$ in the voltage recovery circuit 230 becomes turned on to couple the third node $N_3$ to the power line $L_{VDD}$, such that the voltage $V_3$ is continued to be pulled up to VDD. It is seen that, the rising threshold of the input interface circuit 200 is primarily decided by the dimension relationship between the transistor MN2 in the high-voltage buffering circuit 220 and the transistor MN3 in the voltage recovery circuit 230, and is further associated with the state conversion threshold $VT_{INV2}$ of the inverter INV2. Different from the prior art, the rising threshold of the input interface circuit 200 is not restrained by a limitation of necessarily being lower than (VDD–$V_{TH}$).

A scenario where the voltage $V_P$ starts to gradually reduce from 2*VDD towards zero is discussed. When the voltage $V_4$ is equal to zero and is not yet affected, the transistor MP is turned on such that the voltage $V_3$ is stably kept at VDD. When the voltage $V_P$ reduces to be lower than the state conversion threshold $VT_{INV1}$ of the inverter INV1 in a way that the voltage $V_1$ is reduced to be lower than $VT_{INV1}$, the voltage $V_2$ is converted to VDD, such that the transistor MN1 becomes turned on to start to pull down the voltage $V_3$ from VDD. It is seen that, the falling threshold of the input interface circuit 200 is associated with the state conversion threshold $VT_{INV1}$ of the inverter INV, and can thus be configured according to the dimension relationship between the transistors MPI1 and MNI1 in the inverter INV1.

It should be noted that, although the first node N1 in the input interface circuit 200 is in a floating state during the process in which the voltage $V_P$ rises from (VDD–$V_{TH}$) to VDD, the third node N3 is always kept from floating because at least one of the transistors MN1, MN2, MP and MN3 is turned off at any time point. Thus, the uncertainty in the voltage $V_{IN}$ is effectively eliminated, further keeping the rising threshold of the input interface circuit 200 free from the limitation of necessarily being lower than (VDD–$V_{TH}$). Taking VDD as 1.8 V and the falling threshold designed as 0.9 V for instance, the rising threshold of the input interface circuit 200 may be designed to be as high as 1.3 V, providing a difference of at least 0.4 V between these two thresholds. Compared to the input interface circuit 100 in FIG. 1, the input interface circuit 200 has more robust noise resistance capability.

Figure 4:
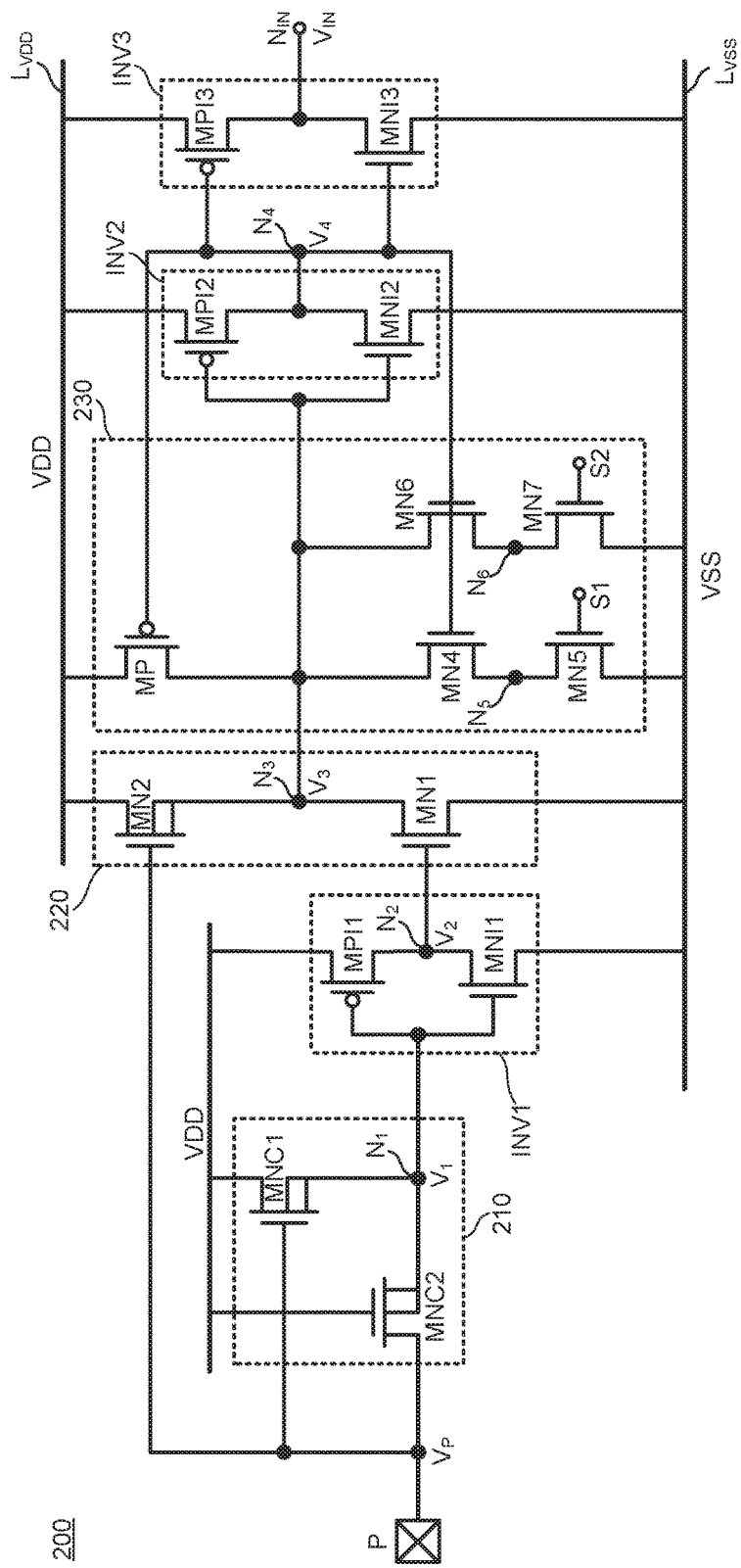
FIG. 4 is a circuit diagram of an input interface circuit according to another embodiment of the present invention, wherein a rising threshold is adjustable.
Figure 5:
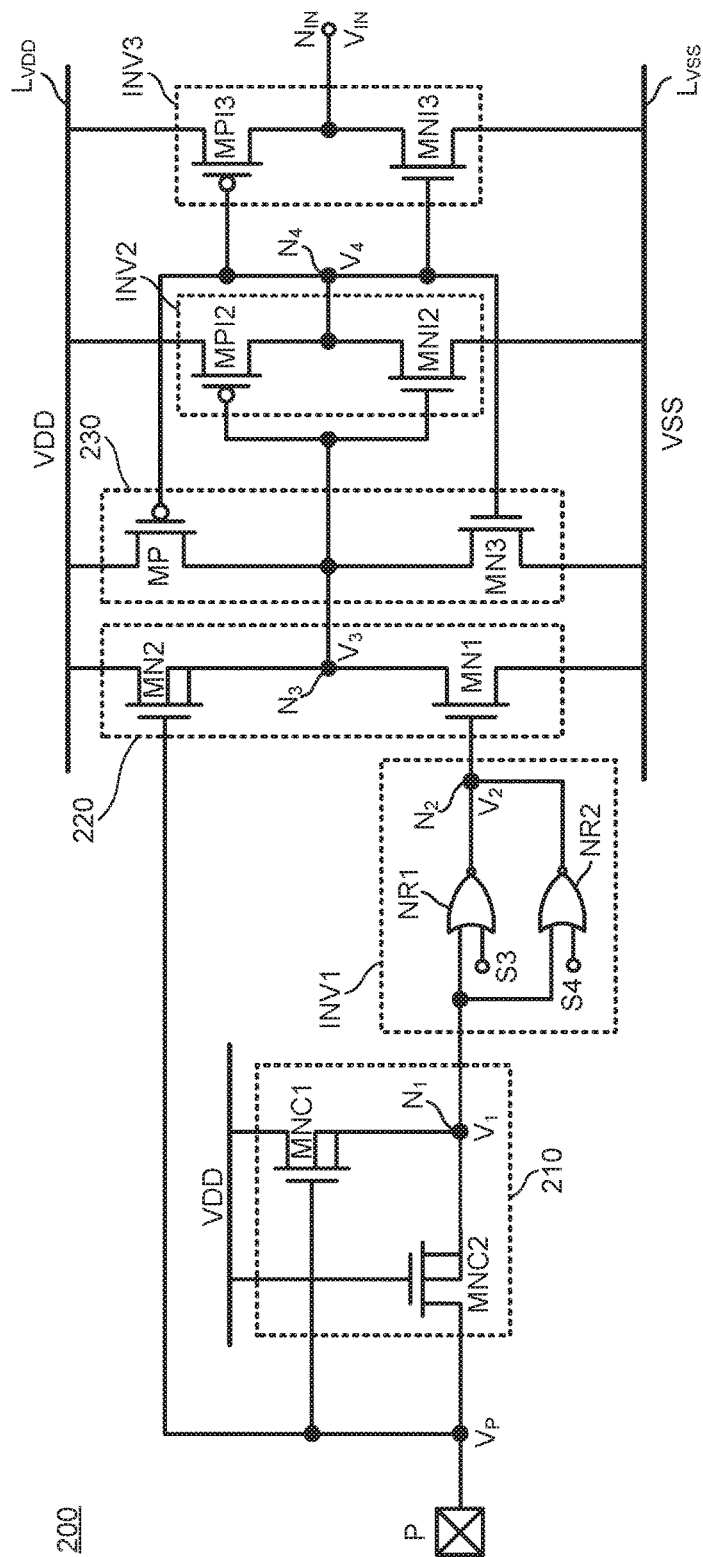
FIG. 5 is a circuit diagram of an input interface circuit according to another embodiment of the present invention, wherein a falling threshold is adjustable.

By adding one or multiple transistors operable and controllable by a control signal, the rising threshold and the falling threshold of the input interface circuit 200 may be further designed to be adjustable. FIG. 4 and FIG. 5 show two examples, respectively, with associated details given below.

As previously described, the rising threshold of the input interface circuit 200 is determined through configuring the dimensions of the transistors MN2, MN3, MPI2 and MNI2. Referring to FIG. 4, in this embodiment, the transistor MN3 in FIG. 3 is replaced by four transistors MN4 to MN7. The transistors MN5 to MN7 are respectively operated and controlled by control nodes S1 and S2 to serve as switches. When voltages at the control nodes S1 and V2 are set to VDD, the transistors MN4 and MN6 are equivalently connected in parallel to form the transistor MN3 in FIG. 3. When the voltage at the control node S1 is set to VDD and the voltage at the control node S2 is set to zero, the transistor MN6 is equivalently non-existent, and only the transistor MN4 is present to be equivalent to the transistor MN3 in FIG. 3. Conversely, when the voltage at the control node S1 is set to zero and the voltage at the control node S2 is set to VDD, only the transistor MN6 is present to be equivalent to the transistor MN3 in FIG. 3. If the transistors MN4 and MN6 have different dimensions, the input interface circuit in FIG. 4 can provide the three threshold options. It should be noted that, applying the above substitution concept to any one of the transistors MN2, MPI2 and MNI2 can also achieve the effect of providing multiple rising threshold options.

As previously described, the falling threshold of the input interface circuit 200 is determined through configuring the dimensions of the transistors MPI1 and MNI1. Referring to FIG. 5, in this embodiment, the inverter INV3 in FIG. 3 is replaced by two NOR gates NR1 and NR2. The NOR gate NR1 is controlled by a control node S3, and the NOR gate N2 is controlled by a control node S4. When voltages at the control nodes S3 and S4 are both set to zero, the NOR gates NR1 and NR2 are equivalently to two inverters connected in parallel to jointly form the inverter INV1 in FIG. 3. When the voltage at the control node S3 is set to zero and the voltage at the control node S4 is set to VDD, the NOR gate NR2 can be ignored (i.e., non-existent), and only the NOR gate NR1 is present as the inverter INV1 in FIG. 3. When the voltage at the control node S3 is set to VDD and the voltage at the control node S4 is set to zero, only the NOR gate NR2 is present as the inverter INV1 in FIG. 2. If the dimensions of the transistors in the NOR gates are set to be different, the input interface circuit in FIG. 5 is capable of providing three falling threshold options.

One person skilled in the art can appreciate that, the concept of providing multiple rising threshold options in FIG. 4 and the concept of providing multiple falling thresholds in FIG. 5 can be concurrently implemented in one single circuit. In addition, there are many other circuit configurations and components capable of achieving the spirit of the present invention without departing therefrom.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An input interface circuit, comprising:
a power line, supplying a default operating voltage;
a ground line, supplying a ground voltage;
an input pad, receiving a pad voltage;
a clamping circuit, coupled between the input pad and a first node, the clamping circuit causing a voltage at the first node to be maintained at the default operating voltage when the pad voltage is higher than the default operating voltage;
a first inverter, having an input end and an output end, the input end coupled to the first node and the output end coupled to a second node;
a high-voltage buffering circuit, having a first input end, a second input end and an output end, the first input end coupled to the input pad, the second input end coupled to the second node, and the output end coupled to a third node, wherein a voltage at the third node is adjusted along with the pad voltage and a voltage at the second node, and the voltage at the third node has a same voltage change trend as the pad voltage;
a second inverter, having an input end and an output end, the input end coupled to the third node and the output end coupled to a fourth node;
a voltage recovery circuit, connected between the power line and the ground line, having an input end and an output end, the input end coupled to the fourth node and the output end coupled to the third node, the third node is selectively coupled to one of the power line and the ground line according to a voltage at the fourth node; and
a third inverter, having an input end thereof coupled to the fourth node and an output end thereof providing a converted voltage.

2. The input interface circuit according to claim 1, wherein the high-voltage buffering circuit comprises:
a first N-type semiconductor metal-oxide field-effect transistor (MOSFET), having a gate thereof coupled to the second node, a drain thereof coupled to the third node, and a source thereof coupled to the ground line; an
a second N-type MOSFET, having a gate thereof coupled to the input pad, a drain thereof coupled to the power line, and a source thereof and a base thereof coupled to the third node.

3. The input interface circuit according to claim 1, wherein the voltage recovery circuit comprises:
a third N-type MOSFET, having a gate thereof coupled to the fourth node, a drain thereof coupled to the third node, and a source thereof coupled to the ground line; an
a P-type MOSFET, having a gate thereof coupled to the fourth node, a drain thereof coupled to the third node, and a source thereof coupled to the power line.

4. The input interface circuit according to claim 1, wherein the voltage recovery circuit comprises:
a P-type MOSFET, having a gate thereof coupled to the fourth node, a drain thereof coupled to the third node, and a source thereof coupled to the power line;
a fourth N-type MOSFET, having a gate thereof coupled to the fourth node, a drain thereof coupled to the third node, and a source thereof coupled to a fifth node;
a fifth N-type MOSFET, having a gate thereof receive a first control signal, a drain thereof coupled to the fifth node, and a source thereof coupled to a ground end;
a sixth N-type MOSFET, having a gate thereof coupled to the fourth node, a drain thereof coupled to the third node, and a source thereof coupled to a sixth node; and
a seventh N-type MOSFET, having a gate thereof receive a second control signal, a drain thereof coupled to the sixth node and a source thereof coupled to the ground end.

5. The input interface circuit according to claim 1, wherein the first inverter comprises:
a first NOR gate, having a first input end thereof coupled to the first node, a second input end thereof receive a third control signal, and an output end thereof coupled to the second node; and
a second NOR gate, having a first input end thereof coupled to the first node, a second input end thereof receive a fourth signal, and an output end thereof coupled to the second node.

6. The input interface circuit according to claim 1, wherein a falling threshold of the input interface circuit is associated with a dimension of a transistor in the first inverter.

7. The input interface circuit according to claim 1, wherein a rising threshold of the input interface circuit is associated with the voltage recovery circuit and a dimension of a transistor in the voltage recovery circuit.

* * * * *